United States Patent [19]
Iannuzzi

[11] Patent Number: 5,846,042
[45] Date of Patent: Dec. 8, 1998

[54] FASTENER/SHAFT LOCKING AND ADJUSTMENT APPARATUS

[75] Inventor: Peter Iannuzzi, Cherry Hill, N.J.

[73] Assignees: Sony Corporation, Tokyo, Japan; Sony Music Entertainment, Inc., New York, N.Y.

[21] Appl. No.: 881,739

[22] Filed: Jun. 24, 1997

[51] Int. Cl.$^6$ .............................. F16B 37/08; F16B 39/10
[52] U.S. Cl. ......................... 411/120; 411/121; 411/408; 411/432
[58] Field of Search .................................. 411/120, 121, 411/217, 218, 219, 221, 321, 432, 956, 408

[56] References Cited

U.S. PATENT DOCUMENTS

| | | | |
|---|---|---|---|
| 1,030,146 | 6/1912 | Wade | 411/221 |
| 1,629,726 | 5/1927 | Morse | 411/221 |
| 3,212,746 | 10/1965 | Wright | 411/120 X |
| 4,801,231 | 1/1989 | Everman | 411/432 |
| 4,971,501 | 11/1990 | Chavez | 411/221 |
| 5,013,197 | 5/1991 | Allaert et al. | 411/432 X |
| 5,533,849 | 7/1996 | Burdick | 411/120 |

*Primary Examiner*—Neill Wilson
*Attorney, Agent, or Firm*—Frommer Lawrence & Haug, LLP; William S. Frommer

[57] ABSTRACT

A fastener/shaft locking and adjustment apparatus and locking system which precisely positions, positively locks and avoids slippage of a positive locking nut along an elongated element. The positive locking nut includes a locking spline, an outer knurled cylinder, a rotatable spline, a return spring and a threaded nut. The locking spline includes a key member extending into the passage thereof which is engaged in the channel of the elongated element such that the locking spline does not rotate with respect to the elongated element. The locking spline further includes a first gear along an outer surface thereof which is capable of meshing engagement with a second gear provided along an inner circumferential cavity of the rotatable spline to lock the locking nut at its desired position along the elongated element. In order to adjust the position of the locking nut along the elongated element, the outer knurled cylinder, which is rotatable with the rotatable spline, is merely pushed and pulled to disengage the first gear from the second gear. The return spring is provided in the space surrounding the main body member of the locking spline for normally biasing the outer knurled cylinder in a locked position so that the first and second gears are normally biased in their engaged position to lock the locking nut along the elongated element. In order to precisely position the locking nut along the elongated element, a plurality of vernier marks are provided on an outward face of the outer knurled cylinder. A fixed notch extends along the length of a main body portion of the locking spline which acts as a reference point to align with the desired vernier mark of the plurality of vernier marks upon rotation of the outer knurled cylinder to precisely position the locking nut relative to the elongated element.

82 Claims, 8 Drawing Sheets

FASTENER/SHAFT LOCKING AND ADJUSTMENT APPARATUS

FIELD OF THE INVENTION

The present invention relates to a fastener/shaft locking and adjustment apparatus and system, and more particularly, relates to a fastener/shaft locking adjustment apparatus and system which incorporates a nut assembly that provides a positive locking feature and can be precisely rotated for fine positioning along an elongated member, such as a shaft.

BACKGROUND OF THE INVENTION

In the past, in order to loosen or tighten collar fasteners on a shaft, set screws have been utilized. Of course, the use of such set screws is extremely time consuming in that additional tooling was typically required to set the screw and such procedure did not permit such shaft collar fastener devices to be precisely positioned.

U.S. Pat. No. 4,893,810 describes a shaft collar locking device intended for retaining weight plates on a weight lifting barbell which attempts to alleviate the need for set screws. In the shaft collar locking device of U.S. Pat. No. 4,893,810, a jam nut method is employed wherein two nuts are rotated in opposite directions so they tighten towards each other and lock to a threaded rod. In order to achieve this result, the shaft collar locking device of U.S. Pat. No. 4,893,810 includes an inner assembly and an outer housing. The inner assembly includes three steel balls, a retaining ring and a spring, and the outer housing includes an inner body portion, an outer cylindrical sleeve and a release ring. The three balls are set in a drilled chamber of the inner body and rest against the inner retaining ring. U.S. Pat. No. 4,893,810 states that the ball bearings are compressed onto the cylindrical shaft thereby jamming the ball bearing between the shaft and the inner retention ring. The shaft collar locking device of U.S. Pat. No. 4,893,810 is thereby set along the shaft.

The shaft collar locking device of U.S. Pat. No. 4,893,810 is released by extending the inner body portion through the inside of the outer cylindrical sleeve, thereby pulling the ball bearings out of the gap between the inner body and the shaft so as to release the collar's retention of the shaft. The spring forces the inner body back to the closed position.

It has been found, however, that the spring loaded balls of the shaft collar locking device of U.S. Pat. No. 4,893,810 can slip along the shaft upon the force of the collar or weight. Moreover, the shaft collar locking device of the type disclosed in U.S. Pat. No. 4,893,810 cannot be positioned precisely. It has therefore been found desirable to provide a shaft collar locking device which does not slip and can be precisely positioned.

OBJECTS OF THE INVENTION

Therefore, it is an object of the present invention to provide a fastener/shaft locking and adjustment apparatus and system which avoids the aforementioned disadvantages of the prior art.

An additional object of the present invention is to provide a fastener/shaft locking and adjustment apparatus and system which provides a positive locking feature and can be precisely rotated for fine positioning.

Another object of the invention is to provide a fastener/shaft locking and adjustment apparatus and system which does not require additional tooling to lock the fastener so it does not become loosened on the shaft.

A further object of this invention is to provide a fastening/shaft locking and adjustment apparatus and system which allows a positive locking nut incorporated thereon to rotate along the shaft by pushing or pulling on an outer cylinder of the nut.

A further object of this invention is to provide a fastener/shaft locking and adjustment apparatus and system which does not slip.

A still further object of this invention is to provide a fastener/shaft locking and adjustment apparatus and system wherein a positive locking nut can be positioned along the shaft in any threaded vernier position of the nut.

Yet another object of this invention is to provide a fastener/shaft locking and adjustment apparatus and system which provides an easy method for making an adjustment to machinery while also providing a positive locking feature.

A still further object of this invention is to provide a fastener/shaft locking and adjustment apparatus and system wherein portions of the apparatus can be molded or cast.

Various other objects, advantages and features of the present invention will become readily apparent from the ensuing detailed description and the novel features will be particularly pointed out in the appended claims.

SUMMARY OF THE INVENTION

In accordance with the present invention, a fastener/shaft locking and adjustment apparatus and system is provided wherein a positive locking nut is provided which is adapted to be axially received and removably fixed along the length of an elongated element, such as a shaft, having a formed channel along the length thereof. This positive locking nut can be used whenever a mechanical adjustment along a threaded shaft is required, that can loosen and change its desired position. The positive locking nut includes a locking spline, an outer knurled cylinder, a rotatable spline, a return spring and a threaded nut.

The locking spline of the positive locking nut includes an axial passage extending therethrough through which the elongated element passes. The locking spline includes a main body member and an end flange. The main body member and the end flange include a key member extending into the passage which is engaged in the channel of the elongated element such that the locking spline does not rotate with respect to the elongated element. The locking spline further includes a first gear provided along the outer circumference of the end flange.

In this positive locking nut, the outer knurled cylinder surrounds the locking spline and defines a space therebetween. The rotatable spline is attached to the outer a knurled cylinder so that the outer knurled cylinder and the rotatable spline are rotatable in unison about the elongated element. The rotatable spline has a second gear provided along an inner circumferential cavity thereof which is capable of meshing engagement with the first gear of the locking spline. The rotatable spline is movable between an engaged position, wherein the second gear is in meshing engagement with the first gear so that the locking nut is locked in its desired position along the elongated element, and a disengaged position, wherein the second gear is disengaged from the first gear so that the outer knurled cylinder and the rotatable spline can be rotated with respect to the elongated element and the position of the locking nut can be adjusted along the length of the elongated element.

The return spring is provided in the space surrounding the main body member of the locking spline for normally biasing the outer knurled cylinder and hence the rotatable spline in its engaged position so that the first and second gears are normally biased in their engaged position to lock the locking nut along the elongated element. As a result, the positive locking nut of the present invention does not slip along the elongated element. The return spring is biased between the end flange of the locking spline and an inwardly extending annular flange of the outer knurled cylinder. In order to move the first and second gears to their disengaged position, the outer knurled cylinder is pushed inwardly toward the rotatable spline such that the bias of the return spring is overcome. Therefore, an object of the present invention is achieved as the positive locking nut is rotated merely by pushing and pulling on the outer knurled cylinder.

In this positive locking nut, the threaded nut is threaded on the elongated element and is secured to the rotatable spline. The threaded nut has an outer surface capable of abutting engagement with a workpiece positioned along the elongated element to prevent further movement of the workpiece along the elongated element in the direction of the locking nut.

In accordance with one of the general objects of the present invention, in this positive locking nut, the rotatable spline can be precisely rotated with respect to the locking spline to precisely position the locking nut along the elongated element. In order to achieve this result, a precise positioning assembly of the positive locking nut of the present invention is provided which includes a plurality of vernier marks formed on an outward face of the outer knurled cylinder. More specifically, the plurality of vernier marks include 60 to 2 vernier marks each respectively designating 6° to 180° angular degrees of rotation. The precise positioning assembly further includes a fixed notch extending along the length of the main body portion of the locking spline opposite to the key member which acts as a reference point to align with the desired vernier mark of the plurality of vernier marks upon rotation of the outer knurled cylinder to precisely position the locking nut relative to the elongated element. Moreover, since the first and second gears each have 60 to 4 teeth, 6 to 180 annular degrees of rotation are respectively provided for each tooth adjustment. As a result, each tooth adjustment of 6 to 180 degrees of angular rotation respectively provides for 0.0008" to 0.100" travel of the locking nut along the elongated element to achieve the desired precise positioning.

BRIEF DESCRIPTION OF THE DRAWINGS

The following detailed description, given by way of example, will best be understood in conjunction with the accompanying drawings in which.

DETAILED DESCRIPTION OF CERTAIN PREFERRED EMBODIMENTS

Referring now to the drawings, wherein like reference numerals are used throughout, and in particular to FIGS. 1a, 1b, 2 and 3, there is illustrated a preferred embodiment of a fastener/shaft locking and adjustment apparatus and system in accordance with the present invention. This fastener/shaft locking and adjustment apparatus 10 incorporates a locking nut 12 which provides a positive locking feature and can be precisely rotated for fine positioning along an elongated member 14, such as a shaft. Therefore, the positive locking nut 12 is adapted to be axially received and removably fixed along the length of the elongated element 14. This fastener/shaft locking and adjustment apparatus is typically used to secure an object by means of the positive locking nut 12 at a precise position along the elongated element. Moreover, this positive locking nut 12 can be used whenever a mechanical adjustment along a threaded shaft is required, than can loosen and change its desired position.

Figure 6:
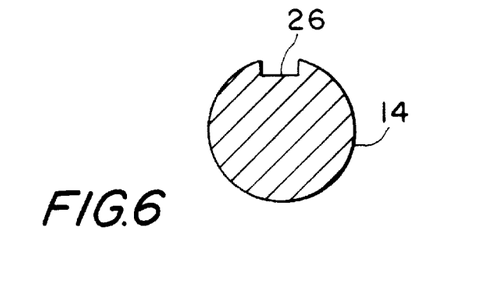
FIG. 6 is a front cross-sectional elevation view of the elongated element of the fastener/shaft locking and adjustment apparatus and system of FIG. 1.

As is shown in FIGS. 1a, 1b, 2 and 3, the positive locking nut 12 of the fastener/shaft apparatus 10 of the present invention includes a locking spline 16, an outer knurled cylinder 18, a rotatable spline 20, a return spring 22 and a threaded nut 24. The elongated element 14 is threaded along the length thereof except for an inwardly extending channel 26 formed along the axial length thereof (see FIG. 6).

Figure 1A:
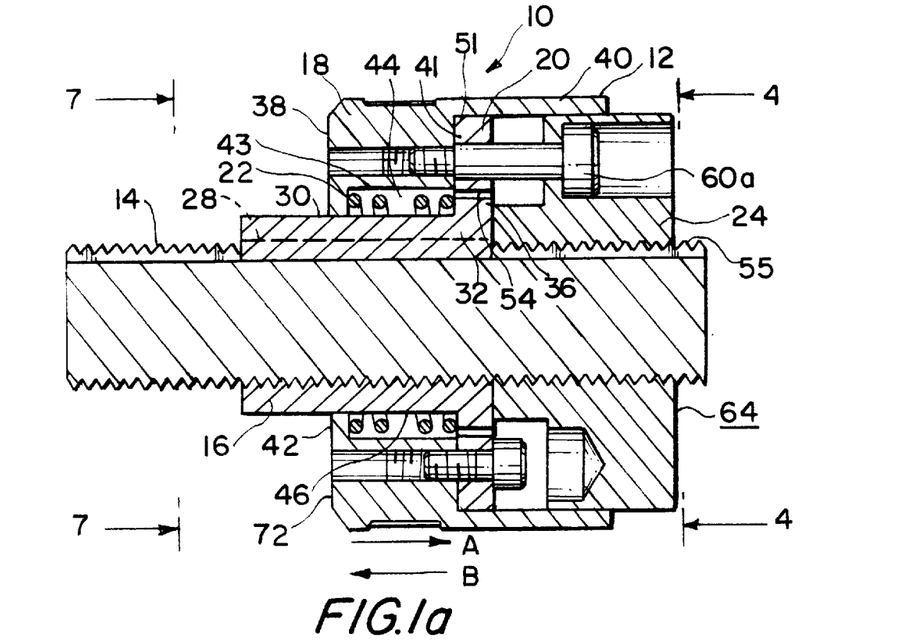
FIG. 1a is a cross-sectional front view of a preferred embodiment of a fastener/shaft locking and adjustment apparatus and system in accordance with the teachings of the present invention specifically illustrating the rotatable spline 20 in its engaged position.
Figure 8:
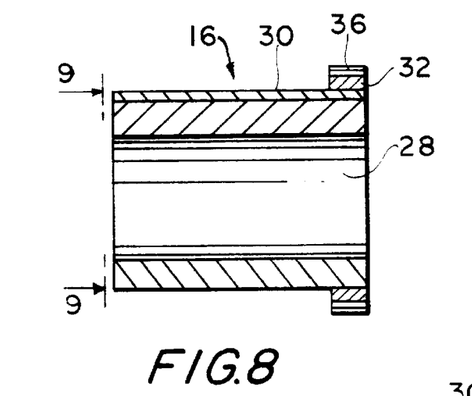
FIG. 8 is a front cross-sectional view of the locking spline of the positive locking nut of FIG. 3.
Figure 9:
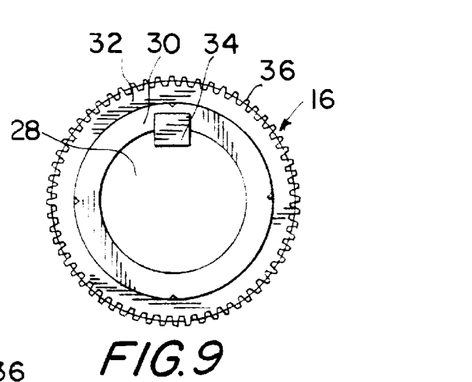
FIG. 9 is a side elevational view of the locking spline of FIG. 8 taken along line 9—9 of FIG. 8.
Figure 10:
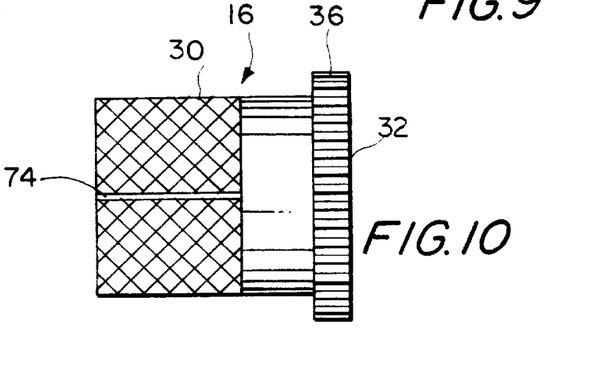
FIG. 10 is a front elevational view of the locking spline of FIG. 8.

The locking spline 16 includes an axially passage 28 extending therethrough through which the elongated element 14 passes (see FIGS. 1a and 8). As is best shown in FIGS. 1a, 1b, 2 and 3, 8 and 10, the locking spline is formed of a main cylindrical body member 30 and a flange member 32 extending outwardly from the main body member 30 at one end thereof. The main body member 30 and the end flange member 32 both include a key member 34 extending into the passage 28 so as to be capable of being received within the channel 26 of the elongated element 14. As a result thereof, the locking spline 16 does not rotate with respect to the elongated element 14. As is best shown in FIGS. 3, 9 and 10, the locking spline 16 further includes a first gear 36 provided along the outer circumference of the end flange 32.

Figure 2:
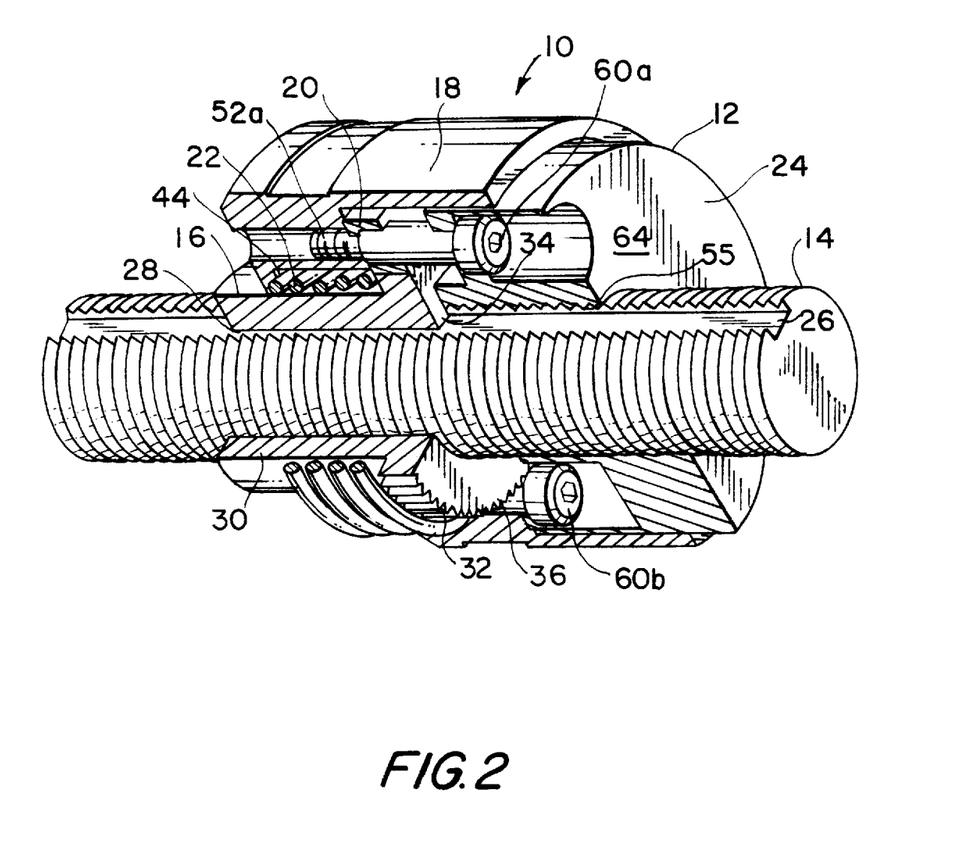
FIG. 2 is a front perspective view, broken away, of the fastener/shaft locking and adjustment apparatus and system of FIG. 1.
Figure 3:
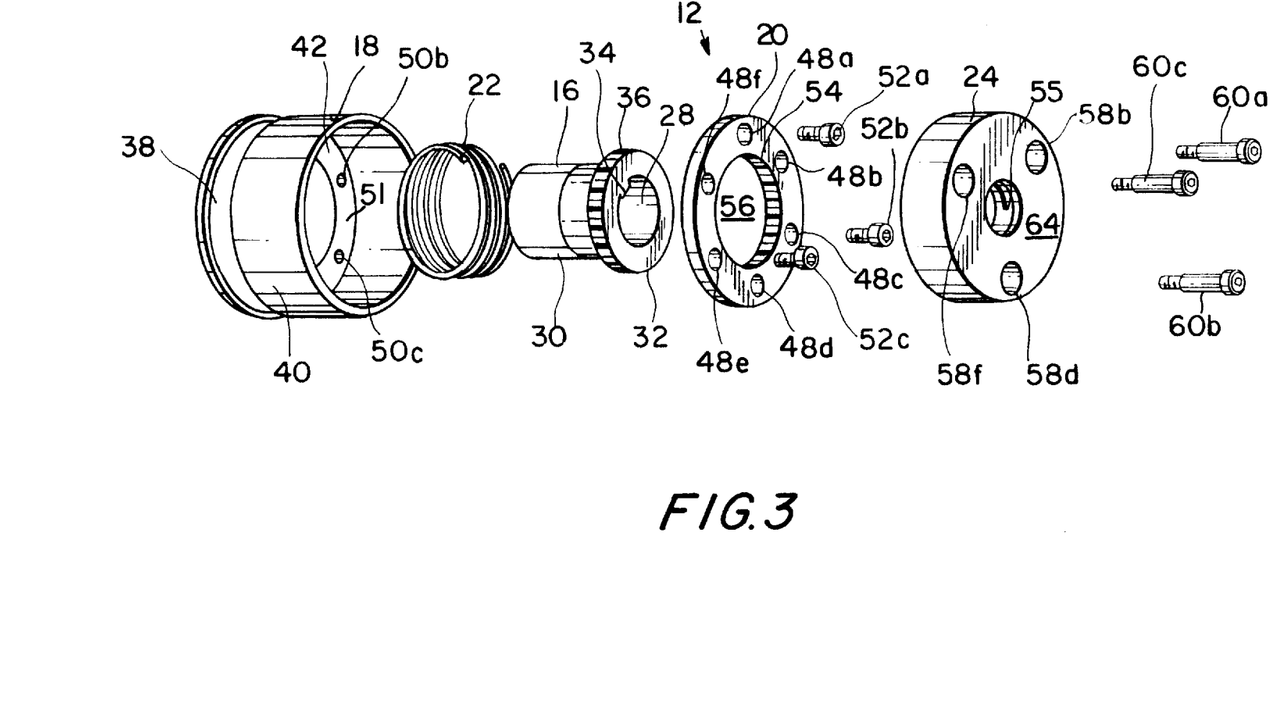
FIG. 3 is a front exploded view of the positive locking nut of the fastener/shaft locking and adjustment apparatus and system of FIG. 1.
Figure 4:
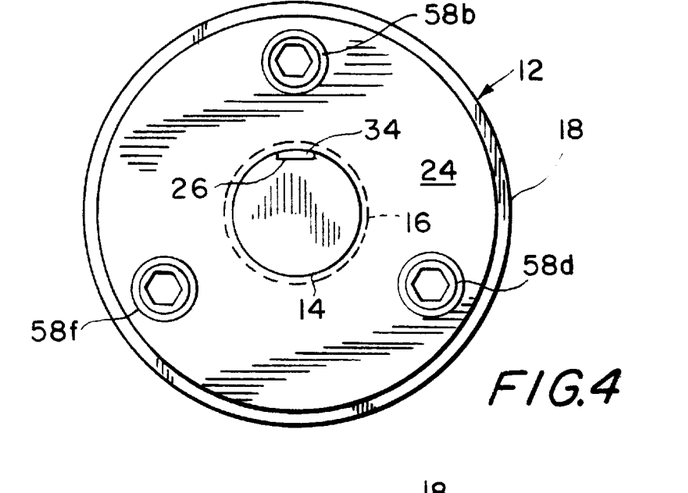
FIG. 4 is a side view of the fastener/shaft locking and adjustment apparatus and system taken along line 4—4 of FIG. 1.
Figure 11:
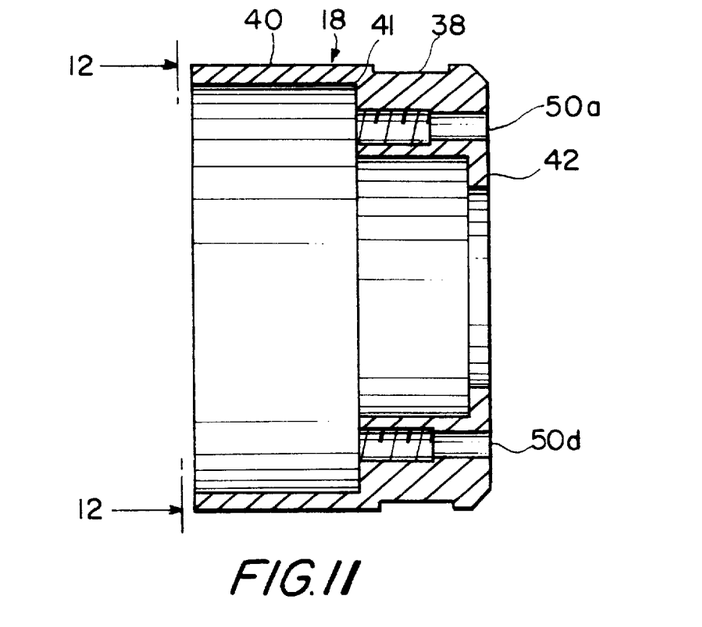
FIG. 11 is a front cross-sectional view of the outer knurled cylinder of the positive locking nut of FIG. 3.
Figure 12:
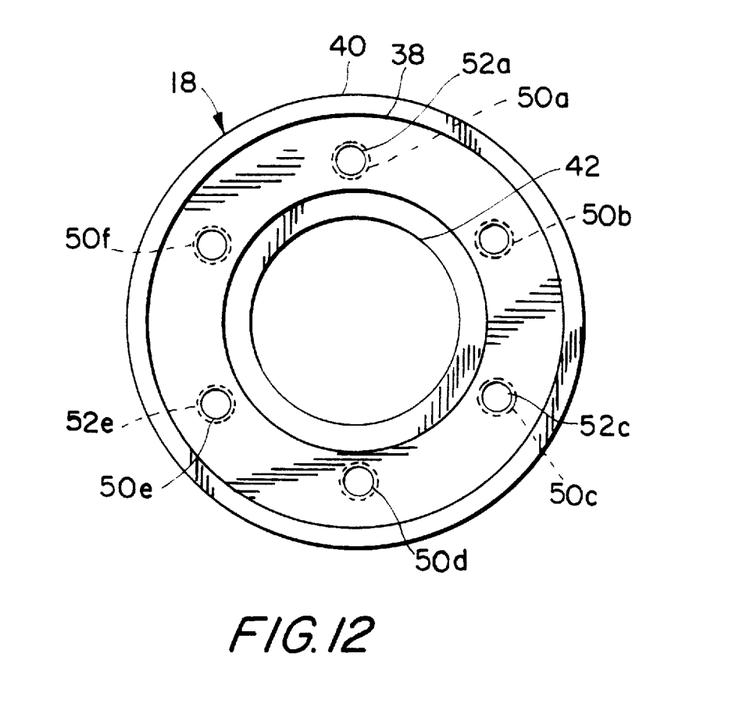
FIG. 12 is a side elevational view of the outer knurled cylinder of FIG. 11 taken along line 12—12 of FIG. 11.
Figure 13:
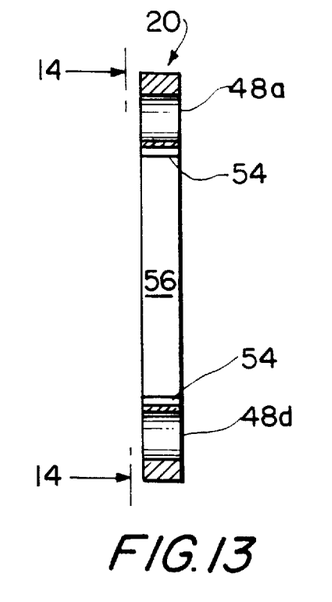
FIG. 13 is a front cross-sectional view of the rotatable spline of the positive locking nut of FIG. 3.

The outer knurled cylinder 18 surrounds the locking spline 16 (see FIGS. 2a and 2). The outer knurled cylinder includes an axially extending main core member 38 and a thin circular member 40 extending from an end 41 of the main core member 38 (see FIG. 11). The outer knurled cylinder also includes an axially inwardly extending flange member 42 which abuts against the main body portion 30 of the locking spline 16 in this positive locking nut (see FIG. 1a). A space 44 is thereby formed between the axially inwardly extending flange member 42 and an inner surface 43 of the main core member 38 of the outer knurled cylinder 18 and the outer surface 44 of the main cylindrical body 46 and the flange member 32 of the locking spline 16 (see FIG. 1a).

As will be discussed in further detail below, the rotatable spline 20 is attached to the outer knurled cylinder 18 so that the outer knurled cylinder 18 and the rotatable spline 20 are rotatable in unison about the elongated element 14. In order to secure the rotatable spline 20 to the outer knurled cylinder 18, fastener openings 48a, 48b, 48c, 48d, 48e and 48f are aligned with through-holes 50a, 50b, 50c, 50d, 50e and 50f provided along the inner surface 51 of the axially inwardly extending flange member 42 of the main core member 38 of the outer knurled cylinder 18 (see FIGS. 1–3 and 11–14). A plurality of fastener members, such as set screws 52a, 52b and 52c, are threaded into the aligned fastener openings 48a, 48c, and 48e and through-holes 50a, 50c, and 50e to secure the rotatable spline 20 to the outer knurled cylinder 18 (see FIGS. 1–3 and 12).

Figure 14:
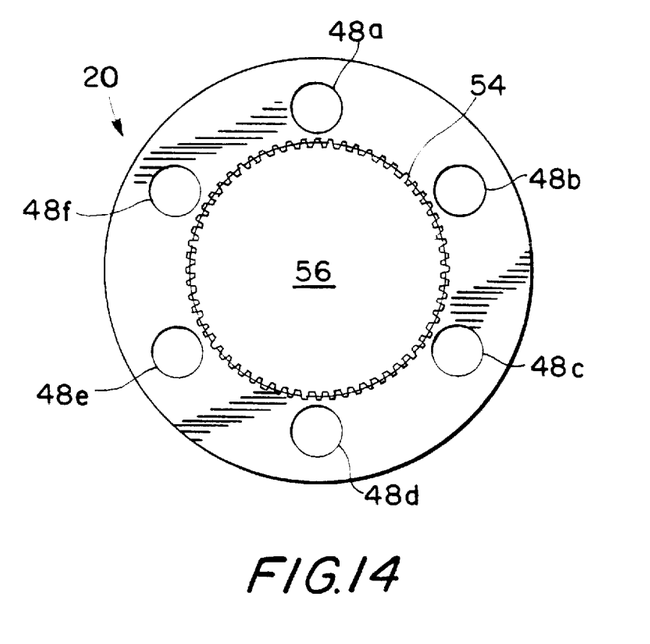
FIG. 14 is a side elevational view of the rotatable spline of FIG. 13 taken along line 14—14 of FIG. 13.
Figure 15:
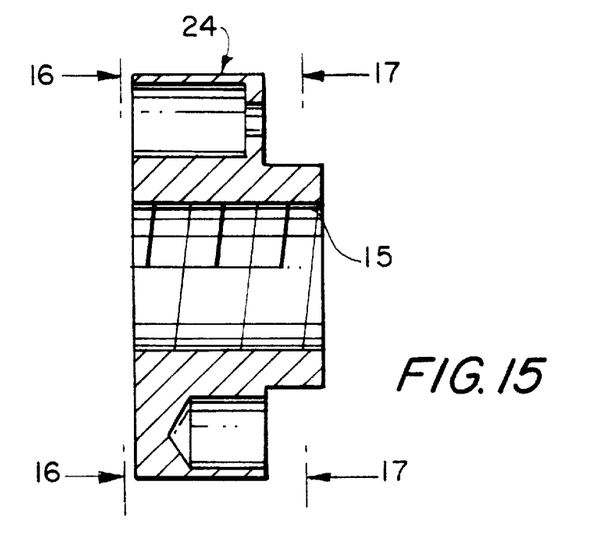
FIG. 15 is a front cross-sectional view of the threaded nut of the positive locking nut of FIG. 3.
Figures 16, 17:
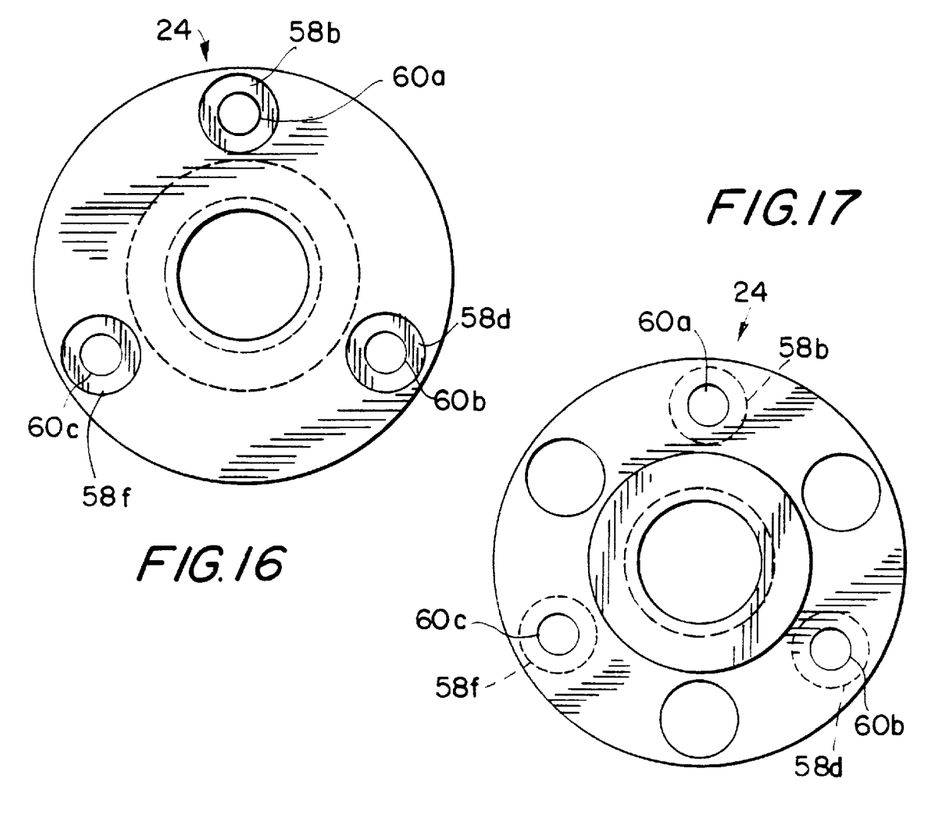
FIG. 16 is a side elevational view of the threaded nut of FIG. 15 taken along line 16—16 of FIG. 15.
FIG. 17 is a side elevational view of the threaded nut of FIG. 15 taken along line 17—17 of FIG. 15.

As is best shown in FIGS. 3 and 14, the rotatable spline 20 further includes a second gear 54 provided along an inner circumferential cavity 56 thereof which, in the assembled position of the positive locking nut of the present invention, is capable of meshing engagement with the first gear 36 of the locking spline 16. As will be discussed in more detail below, the rotatable spline 20 is movable between an engaged position, wherein the second gear 54 is in meshing engagement with the first gear 36 so that the locking nut is locked in its desired position along the elongated element 14 (see FIG. 1a), and a disengaged position, wherein the second gear 54 is disengaged from the first gear 36 so that the outer knurled cylinder 18 and the rotatable spline 20 can be rotated with respect to the elongated element 14 and the position of the locking nut can be adjusted along the elongated element (see FIG. 1b).

As shown in FIG. 1a, the return spring 22 is provided in the annular space 44 formed between the locking spline 16 and outer knurled cylinder 18. The return spring 22 normally biases the outer knurled cylinder 18 and the rotatable spline 20 in a locked position with respect to the locking spline 16. As a result, the rotatable spline 20 is normally biased in its engaged position such that the first and second gears 36 and 54 are in meshing engagement with one another to thereby lock the locking nut 12 in its desired position along the elongated element 14. As a result, the locking nut 12 does not slip along the elongated element 14.

The return spring 22 is biased between the end flange member 32 of the locking spline 16 and the inwardly extending flange member 42 of the outer knurled cylinder 18. In order to move the first and second gears 36 and 54 to their disengaged position of FIG. 1b, the outer knurled cylinder 18 is pushed towards the rotatable spline 20 in the direction of arrow A such that the bias of the return spring 22 is overcome. When the desired position of the positive locking nut 12 is reached along the elongated element 14, the outer knurled cylinder 18 is pulled forwardly in the direction of arrow B such that the return spring 22 is in its normally biased position and the first and second gears 36 and 54 are automatically returned to their meshing engaged position of FIG. 1a. Therefore, an object of the present invention is achieved as the positive locking nut can be rotated about the elongated element merely by pushing or pulling on the outer knurled cylinder 18.

In the positive locking nut of the present invention, the threaded nut 24 has a threaded inner opening 55 so that the threaded nut 24 is threaded on the elongated element. The threaded nut 24 is secured to the rotatable spline 20 (see FIGS. 1–3 and 15). In order to provide the aforementioned securement, the threaded nut 24 includes fastener openings 58a, 58b and 58c bored therein which are aligned with corresponding fastener openings 48b, 48d and 48f of the rotatable spline 20. Fasteners 60a, 60b and 60c are then inserted through the fastener openings 58b, 58d, 58f of the threaded nut 24 and the fastener openings 48b, 48d and 48f of the rotatable spline to provide securement of the threaded nut to the rotatable spline (see FIGS. 1–3, 14 and 16–17). In addition, the threaded nut 24 has an outer surface 64 which is capable of abutting engagement with a workpiece (not shown) positioned along the elongated element to prevent further movement of the workpiece along the elongated element in the direction of the locking nut.

Figure 7:
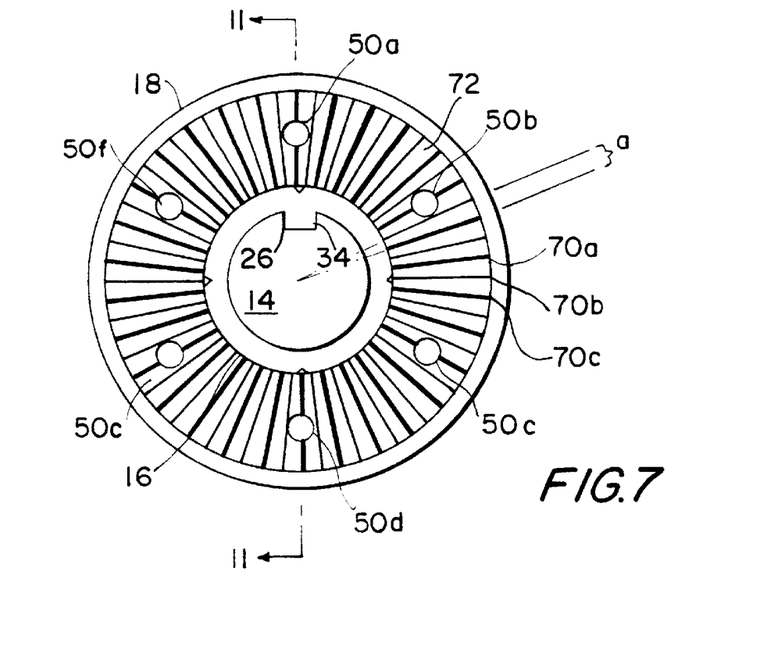
FIG. 7 is a side view of the fastener/shaft locking and adjustment apparatus and system taken along line 7—7 of FIG. 1.

Advantageously, this positive locking nut allows the rotatable spline 20 to be precisely rotated with respect to the locking spline 16 to precisely position the locking nut along the elongated element 14. In order to achieve this result, a precise positioning system is provided in the locking nut 12 of the present invention. More specifically, as is best shown in FIG. 7, a plurality of vernier marks, such as 70a, 70b, 70c, etc., are provided on an outward face end 72 of the main core member 38 of the outer knurled cylinder opposite to the end 41. More specifically, the plurality of vernier marks 70a, 70b and 70c include preferably 60 to 2 vernier marks, each respectively designating 6° to 180° angular degrees of rotation between adjacent vernier marks as represented by the angle α in FIG. 7.

Figure 5:
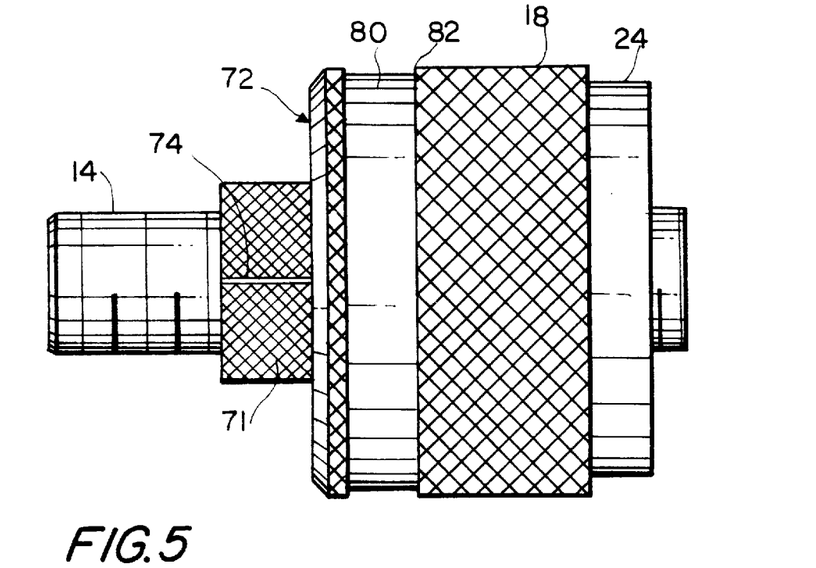
FIG. 5 is a front elevational view of the fastener/shaft locking and adjustment apparatus and system of FIG. 1.

The precise positioning system of the positive locking nut 12 of the present invention further includes a fixed notch 74 (see FIGS. 5 and 10) extending along the length of the main body member 30 of the locking spline 16. This fixed notch 74 is positioned on the outer surface 77 of the main body member 30 opposite to the key member 34. As a result, the fixed notch 74 acts as a reference point to align with the desired vernier mark of the plurality of vernier marks 70a, b, c, etc. upon rotation of the outer knurled cylinder 18 to precisely position the locking nut 12 relative to the elongated element 14. Moreover, since the first and second gears 36 and 54 both have 60 to 4 gear teeth, 6 to 180 angular degrees of rotation respectively are provided for each tooth adjustment. As a result, each tooth adjustment of 6 to 180 degrees of angular rotation provides respectively for 0.0008" to 0.100" travel of the locking nut on the elongated element to achieve the desired precise positioning. In order to indicate to the user that each tooth adjustment provides for the desired 0.0008" to 0.100" travel of the locking nut, a label reference 80 (see FIG. 5) reflecting the same can be provided in an annular groove 82 formed in the main core member 38 of the outer knurled cylinder 18.

As aforementioned, the fixed notch 74 can be used as a reference point with respect to the vernier marks 70*a, b, c,* etc. provided on the outer knurled cylinder 18. More specifically, the fixed notch 74 cannot rotate, so as the knurled outer cylinder 18 is rotated, the vernier marks on the cylinder passing the fixed notch can be counted. By multiplying the number of counted vernier marks by the travel division from the label reference 80, the amount of travel can be easily calculated. For example, if the label reference 80 indicates div=0.0008" and the outer knurled cylinder 18 is rotated such that 4 vernier marks pass by the fixed notch 74, the positive locking nut 12 has thus travelled 0.0032".

In use, the locking nut 12 is positioned on the elongated element 14 by inserting the key member 34 of the locking spline 16 into the channel 26 of the elongated member. As a result, the locking spline 16 remains in a stationary position with respect to the elongated member. The nut member 24 is then threadably received on the elongated element. In order to initially position the locking nut along the elongated element 14, the outer knurled cylinder 18 is pressed inwardly at its end 72 in the direction of the threaded nut 24, such as is in the direction A in FIG. 1*a* and 1*b*. As a result, the return spring 22 is compressed from its normally biased position and the first and second gears 36 and 54, respectively, are moved to their disengaged positions such that the positive locking nut can be rotated clockwise or counterclockwise and positioned along the elongated element (see FIG. 1*b*). When the desired position is obtained along the elongated element 14, the force applied to the outer knurled cylinder 18 is released to thereby push the return spring 22 to its normally biased position so that the first and second gears 36 and 54 are in their engaged meshing position (see FIG. 1*a*). Next, in order to precisely position the locking nut relative to the elongated element, the fixed notch 74 of the locking spline 16 is set at the desired reference point. The outer knurled cylinder is once again pushed inwardly so that the desired vernier mark, such as 70*a, b, c,* etc. is aligned with the fixed notch 74 to thereby provide a positioning within the desired accuracy of 0.0008" to 0.100" travel along the elongated element depending on the number of teeth for each tooth adjustment.

Figure 1B:
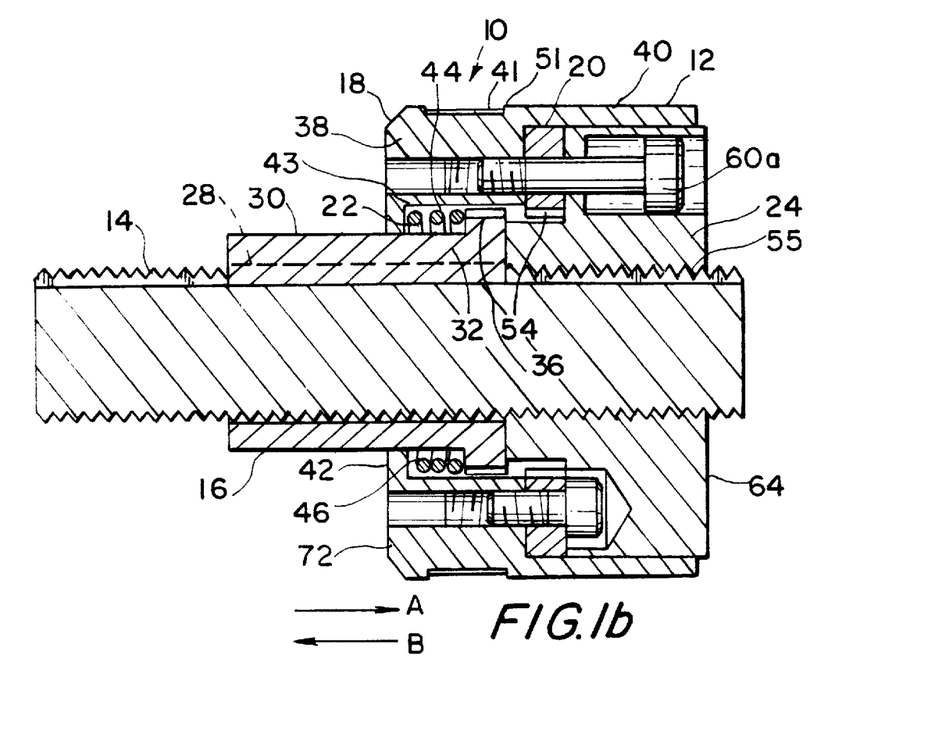
FIG. 1b is a cross-sectional front view of a preferred embodiment of the fastener/shaft locking and adjustment apparatus and system of FIG. 1a specifically illustrating the rotatable spline 20 in its disengaged position.

In summary, the knurled outer cylinder 18 is pushed inwardly toward the threaded nut 24. As a result, as shown in FIG. 1*b,* the first and second gears 36 and 54 will disengage. While continuing to push the knurled outer cylinder 18 inwardly, the outer knurled cylinder 18 is rotated clockwise or counterclockwise to position the locking nut on the elongated element. The fastener members 60*a,* 60*b* and 60*c* fastened to the outer knurled cylinder drive the threaded nut 24 as the cylinder rotates (see FIG. 1*b*). Upon release of the pressure on the outer knurled cylinder 18, return spring 22 will return automatically to its biased position so that the first and second gears are simultaneously brought into meshing engagement with one another thereby preventing the locking nut 12 from rotating (see FIG. 1*a*). Accordingly, the locking nut 12 will not slip along the elongated element 14. Then, the precise positioning system can be utilized to obtain a precise positioning of the locking nut along the elongated element to within a 0.0008" accuracy of the travel.

Based upon the foregoing, it will be appreciated that a fastener/shaft locking and adjustment apparatus and system has been designed which provides for a precise positioning of a locking nut along an elongated element. Additionally, no additional tooling is necessary to lock the locking nut along the elongated element as no set screws are utilized to lock the locking nut with respect to the elongated element. Further, an advantageous feature of the present invention is achieved by the design of the fastener/shaft locking apparatus of the present invention as the locking nut can be rotated along the elongated element simply by pushing or pulling on the outer knurled cylinder 18 of the locking nut.

While the present invention has been particularly shown and described with reference to certain preferred embodiments, it will be readily apparent to those of ordinary skill in the art that various changes and modifications may be made therein without departing from the spirit or the scope of the invention. It is intended that the appended claims be interpreted as including the foregoing as well as various other such changes and modifications.

What is claimed is:

1. A positive locking nut adapted to be axially received on and to be removably fixed along the length of an elongated element having a channel along the length thereof, comprising: a first generally cylindrical body member having an axially extending passage extending therethrough for receiving said element, said first body member having a key member extending into said passage which is engaged in the channel of the elongated element such that said first body member does not rotate with respect to said elongated element; said first body member further including a first gear along an end flange thereof;

a second generally cylindrical body member surrounding said first cylindrical body member and defining a space therebetween wherein said second body member is in the form of a spring-loaded outer knurled cylinder;

a third cylindrical body member attached to said second body member so that said second and third body members are rotatable about said elongated element, said third body member having a second gear capable of meshing engagement with said first gear wherein said third body member is movable between an engaged position, wherein said second gear is in meshing engagement with said first gear so that the locking nut is locked in its desired position along the elongated element, and a disengaged position, wherein said second gear is disengaged from said first gear so that the second and third body members can be rotated with respect to the elongated element and the position of the locking nut can be adjusted along the elongated element; and     means for biasing provided in said space surrounding said first body member for normally biasing said second body member in a locked position wherein said first and second gears are in said engaged position.

2. The positive locking nut of claim 1 wherein said first and second gears can be moved to said disengaged position by pushing said second body member toward said third body member.

3. The positive locking nut of claim 1 and further including a nut member threaded on said elongated element and attached to said third body member, said nut member having an outer surface capable of abutting engagement with a workpiece positioned along said elongated element to prevent further movement of the workpiece along the elongated element in the direction of the locking nut.

4. The positive locking nut of claim 3 wherein said nut member is attached to said third body member by a first set of fastening means which ride and are movable in equally spaced fastening openings of said nut member when said third body member is moved between said engaged and disengaged positions.

5. The positive locking nut of claim 3 wherein said second and third body members included corresponding sets of through-holes for receiving a second set of fastening means for securing said second and third body members.

6. The positive locking nut of claim 1 wherein said biasing means is a return spring which is biased between said end flange of said first body member and an inwardly extending annular flange of second and third body members.

7. The positive locking nut of claim 1 wherein said first body member is in the form of a locking spline keyed to said elongated element.

8. The positive locking nut of claim 1 wherein said third body member is in the form of a rotating spline.

9. The positive locking nut of claim 1 and further including means for precisely positioning the locking nut along said elongated element.

10. The positive locking nut of claim 9 wherein said precise positioning means includes a plurality of vernier marks being provided on an outward face of said second body member.

11. The positive locking nut of claim 10 wherein said plurality of vernier marks includes 60 to 2 vernier marks each designating respectively 6° to 180° angular degrees of rotation.

12. The positive locking nut of claim 10 wherein said precise positioning means further includes a fixed notch extending along the length of a main body portion of said first body member which acts as a reference point to align with the desired vernier mark of said plurality of vernier marks upon rotation of said second body member to precisely position the locking nut relative to said elongated element.

13. The positive locking nut of claim 1 wherein said first and second gears each have 60 to 4 teeth to thereby respectively provide 6 to 180 angular degrees of rotation for each tooth adjustment.

14. The positive locking nut of claim 13 wherein each tooth adjustment of 6° to 180° degrees of angular rotation provides respectively for 0.0008" to 0.100" travel of the locking nut on said elongated element to provide for precise positioning of the locking nut along said elongated element.

15. A positive locking nut adapted to be axially received on and to be removably fixed along the length of an elongated element having a channel along the length thereof, comprising:

a first generally cylindrical body member having an axially extending passage extending therethrough for receiving said element, said first body member having a key member extending into said passage which is engaged in the channel of the elongated element such that said first body member does not rotate with respect to said elongated element;

a second generally cylindrical body member surrounding said first cylindrical body member and defining a space therebetween;

a third cylindrical body member attached to said second body member so that said second and third body members are rotatable about said elongated element; and means for precisely positioning the locking nut along said elongated element by precisely defining the angular rotation of said second and third body members with respect to said elongated element.

16. The positive locking nut of claim 15 wherein said precise positioning means includes a plurality of vernier marks being provided on an outward face of said second body member.

17. The positive locking nut of claim 16 wherein said plurality of vernier marks includes 60 to 2 vernier marks each respectively designating 6° to 180° angular degrees of rotation.

18. The position locking nut of claim 16 wherein said precise positioning means further includes a fixed notch extending along the length of a main body position of said first body member which acts as a reference point to align with the desired vernier mark of said plurality of vernier marks upon rotation of said second body member to precisely position the locking nut relative to said elongated element.

19. The positive locking nut of claim 16 wherein said precise positioning means further includes a first gear provided along an end flange of said first body member and a second gear being provided on said third body member capable of meshing engagement with said first gear wherein said second gear is movable between an engaged position, wherein said second gear is meshing engagement with said first gear so that the locking nut is locked in its desired position along the elongated element, and a disengaged position, wherein said third body member is disengaged from said first gear so that said second and third body members can be rotated with respect to the elongated element and the position of the locking nut can be adjusted along the elongated element.

20. The positive locking nut of claim 19 wherein said first and second gears can be moved to said disengaged position by pushing said second body member inwardly.

21. The positive locking nut of claim 19 wherein said first and second gears each have 60 to 4 teeth to thereby provide respectively 6 to 180 angular degrees of rotation for each tooth adjustment.

22. The positive locking nut of claim 21 wherein each tooth adjustment of 6 to 180 degrees of angular rotation for respectively 0.0008" to 0.100" travel of the locking nut on said elongated element to provide for precise positioning of the locking nut along said elongated element.

23. A positive locking nut adapted to be axially received on and to be removably fixed along the length of an elongated element having a channel along the length thereof, comprising:

a locking spline having an axially extending passage extending therethrough for receiving said element, said locking spline having a key member extending into said passage which is engaged in the channel of the elongated element such that said locking spline does not rotate with respect to said elongated element, said locking spline further including a first gear along an end flange thereof;

an outer knurled cylinder surrounding said locking spline and defining a space therebetween;

a rotatable spline attached to said outer knurled cylinder so that said outer knurled cylinder and said rotatable spline are rotatable about said elongated element, said rotatable spline having a second gear capable of meshing engagement with said first gear wherein said rotatable spline is movable between an engaged position, wherein said second gear is in meshing engagement with said first gear so that the locking nut is locked in its desired position along the elongated element, and a disengaged position, wherein said second gear is disengaged from said first gear so that said outer knurled cylinder and said rotatable spline can be rotated with respect to the elongated element and the position of the locking nut can be adjusted along the elongated element; and a return spring provided in said space surrounding said locking spline for normally biasing said outer knurled cylinder in a locked position so that said first and second gears are normally biased in said engaged position to lock the locking nut along the elongated element.

24. The positive locking nut of claim 23 wherein said first and second gears can be moved to said disengaged position by pushing said outer knurled cylinder inwardly.

25. The positive locking nut of claim 23 and further including a nut member threaded on said elongated element and attached to said rotatable spline, said nut member having an outer surface capable of abutting engagement with a workpiece positioned along said elongated element to prevent further movement of the workpiece along the elongated element in the direction of the locking nut.

26. The positive locking nut of claim 25 wherein said nut member is attached to said outer knurled cylinder by a first set of fastening means which ride and are movable in equally spaced fastening openings of said nut member when said rotatable spline is moved between said engaged and disengaged positions.

27. The positive locking nut of claim 25 wherein said outer knurled cylinder and said rotatable spline include corresponding sets of through-holes for receiving a second set of fastening means for securing said second knurled cylinder and said rotatable spline.

28. The positive locking nut of claim 23 wherein said return spring is biased between said end flange of said locking spline and an inwardly extending annular flange of said outer knurled cylinder.

29. The positive locking nut of claim 23 and further including means for precisely positioning the locking nut along said elongated element.

30. The positive locking nut of claim 29 wherein said precise positioning means includes a plurality of vernier marks being provided on an outward face of said outer knurled cylinder.

31. The positive locking nut of claim 30 wherein said plurality of vernier marks includes 60 to 2 vernier marks each respectively designating 6° to 180° angular degrees of rotation.

32. The positive locking nut of claim 31 wherein said precise positioning means further includes a fixed notch extending along the length of a main body portion of said locking spline which acts as a reference point to align with the desired vernier mark of said plurality of vernier marks upon rotation of said outer knurled cylinder to precisely position the locking nut relative to said elongated element.

33. The positive locking nut of claim 32 wherein said first and second gears each have 60 to 4 teeth to thereby provide respectively 6 to 180 angular degrees of rotation for each tooth adjustment.

34. The positive locking nut of claim 33 wherein each tooth adjustment of 6 to 180 degrees of angular rotation provides respectively for 0.0008" to 0.100" travel of the locking nut on said elongated element to provide for precise positioning of the locking nut along said elongated element.

35. A fastener/shaft locking and adjustment apparatus comprising:
   a threaded elongated element having a channel along the length thereof;
   a positive locking nut adapted to be axially received on and removably fixed along the length of said elongated element, the positive locking nut comprising:
      a first generally cylindrical body member having an axially extending passage extending therethrough for receiving said element, said first body member having a key member extending into said passage which is engaged in the channel of the elongated element such that said first body member does not rotate with respect to said elongated element; said first body member further including a first gear along an end flange thereof;
      a second generally cylindrical body member surrounding said first cylindrical body member and defining a space therebetween wherein said second body member is in the form of a spring-loaded outer knurled cylinder;
      a third cylindrical body member attached to said second body member so that said second and third body members are rotatable about said elongated element, said third body member having a second gear capable of meshing engagement with said first gear wherein said third body member is movable between an engaged position, wherein said second gear is in meshing engagement with said first gear so that the locking nut is locked in its desired position along the elongated element, and a disengaged position, wherein said second gear is disengaged from said first gear so that the second and third body members can be rotated with respect to the elongated element and the position of the locking nut can be adjusted along the elongated element; and
      means for biasing provided in said space surrounding said first body member for normally biasing said second body member in a locked position wherein said first and second gears are in said engaged position.

36. The fastener/shaft locking and adjustment apparatus of claim 35 wherein said first and second gears can be moved to said disengaged position by pushing said second body member toward said third body member.

37. The fastener/shaft locking and adjustment apparatus of claim 35 wherein said locking nut further includes a nut member threaded on said elongated element and attached to said third body member, said nut member having an outer surface capable of abutting engagement with a workpiece positioned along said elongated element to prevent further movement of the workpiece along the elongated element in the direction of the locking nut.

38. The fastener/shaft locking and adjustment apparatus of claim 37 wherein said nut member is attached to said third body member by a first set of fastening means which ride and are movable in equally spaced fastening openings of said nut member when said third body member is moved between said engaged and disengaged positions.

39. The fastener/shaft locking and adjustment apparatus of claim 37 wherein said second and third body members included corresponding sets of through-holes for receiving a second set of fastening means for securing said second and third body members.

40. The fastener/shaft locking and adjustment apparatus of claim 35 wherein said biasing means is a return spring which is biased between said end flange of said first body member and an inwardly extending annular flange of said second and third body members.

41. The fastener/shaft locking and adjustment apparatus of claim 35 wherein said first body member is in the form of a locking spline to said elongated element.

42. The fastener/shaft locking and adjustment apparatus of claim 35 wherein said third body member is in the form of a rotating spline.

43. The fastener/shaft locking and adjustment apparatus of claim 35 wherein said positive locking nut further includes means for precisely positioning the locking nut along said elongated element.

44. The fastener/shaft locking adjustment apparatus of claim 43 wherein said precise positioning means includes a plurality of vernier marks being provided on an outward face of said second body member.

45. The fastener/shaft locking and adjustment apparatus of claim 43 wherein said plurality of vernier marks includes 60 to 2 vernier marks each designating respectively 6 to 180 angular degrees of rotation.

46. The fastener/shaft locking and adjustment apparatus of claim 43 wherein said precise positioning means further includes a fixed notch extending along the length of a main body portion of said first body member which acts as a reference point to align with the desired vernier mark of said plurality of vernier marks upon rotation of said second body member to precisely position the locking nut relative to said elongated element.

47. The fastener/shaft locking adjustment apparatus of claim 35 wherein said first and second gears each have 60 to 4 teeth to thereby respectively provide 6° to 180° angular degrees of rotation for each tooth adjustment.

48. The fastener/shaft locking and adjustment apparatus of claim 47 wherein each tooth adjustment of 6° to 180° degrees of angular rotation respectfully provides for 0.0008" to 0.100" travel of the locking nut on said elongated element to provide for precise positioning of the locking nut along said elongated element.

49. A fastener/shaft locking adjustment apparatus comprising:
   a threaded elongated element having a channel formed along the length thereof;
   a positive locking nut adapted to be axially received on and removably fixed along the length of the elongated element, said positive locking nut comprising:
      a first generally cylindrical body member having an axially extending passage extending therethrough for receiving said element, said first body member having a key member extending into said passage which is engaged in the channel of the elongated element such that said first body member does not rotate with respect to said elongated element;
      a second generally cylindrical body member surrounding said first cylindrical body member and defining a space therebetween;
      a third cylindrical body member attached to said second body member so that said second and third body members are rotatable about said elongated element; and
      means for precisely positioning the locking nut along said elongated element by precisely defining the angular rotation of said second and third body members with respect to said elongated element.

50. The fastener/shaft locking and adjustment apparatus of claim 49 wherein said precise positioning means includes a plurality of vernier marks being provided on an outward face of said second body member.

51. The fastener/shaft locking and adjustment apparatus of claim 50 wherein said plurality of vernier marks includes 60 to 2 vernier marks each respectively designating 6° to 180° angular degrees of rotation.

52. The fastener/shaft locking and adjustment apparatus of claim 50 wherein said precise positioning means further includes a fixed notch extending along the length of a main body position of said first body member which acts as a reference point to align with the desired vernier mark of said plurality of vernier marks upon rotation of said second body member to precisely position the locking nut relative to said elongated element.

53. The fastener/shaft locking and adjustment apparatus of claim 50 wherein said precise positioning means further includes a first gear provided along an end flange of said first body member and a second gear being provided on said third body member capable of meshing engagement with said first gear wherein said third body member is movable between an engaged position, wherein said second gear is meshing engagement with said first gear so that the locking nut is locked in its desired position along the elongated element, and a disengaged position, wherein said second gear is disengaged from said first gear so that said second and third body members can be rotated with respect to the elongated element and the position of the locking nut can be adjusted along the elongated element.

54. The fastener/shaft locking adjustment apparatus of claim 53 wherein said third body member can be moved to said disengaged position thereby disengaging said first and second gears by pushing said second body member inwardly.

55. The fastener/shaft locking and adjustment apparatus of claim 54 wherein said first and second gears each have 60 to 4 teeth to thereby respectively provide 6° to 180° angular degrees of rotation for each tooth adjustment.

56. The fastener/shaft locking and adjustment apparatus of claim 55 wherein each tooth adjustment of 6 to 180 degrees of angular rotation respectively provides for 0.0008" to 0.100° travel of the locking nut on said elongated element to provide for precise positioning of the locking nut along said elongated element.

57. A fastener/shaft locking and adjustment apparatus comprising:
   a threaded elongated element having a channel formed along the length thereof;
   a positive locking nut adapted to be axially received on and to be removably fixed along the length of the elongated element, said positive locking nut comprising:
      a locking spline having an axially extending passage extending therethrough for receiving said element, said locking spline having a key member extending into said passage which is engaged in the channel of the elongated element such that said locking spline does not rotate with respect to said elongated element, said locking spline further including a first gear along an end flange thereof;
      an outer knurled cylinder surrounding said locking spline and defining a space therebetween;
      a rotatable spline attached to said outer knurled cylinder so that said outer knurled cylinder and said rotatable spline are rotatable about said elongated element, said rotatable spline having a second gear capable of meshing engagement with said first gear wherein said rotatable spline is movable between an engaged position, wherein said second gear is in meshing engagement with said first gear so that the locking nut is locked in its desired position along the elongated element, and a disengaged position, wherein said second gear is disengaged from said first gear so that said outer knurled cylinder and said rotatable spline can be rotated with respect to the elongated element and the position of the locking nut can be adjusted along the elongated element; and
      a return spring provided in said space surrounding said locking spline for normally biasing said outer knurled cylinder in a locked position so that said first and second gears are normally biased in said engaged position to lock the locking nut along the elongated element.

58. The fastener/shaft locking and adjustment apparatus of claim 57 wherein said first and second gears can be moved to said disengaged position by pushing said outer knurled cylinder toward said rotatable spline.

59. The fastener/shaft locking and adjustment apparatus of claim 57 wherein said positive locking nut further includes a nut member threaded on said elongated element and attached to said rotatable spline, said nut member having an outer surface capable of abutting engagement with a workpiece positioned along said elongated element to prevent further movement of the workpiece along the elongated element in the direction of the locking nut.

60. The fastener/shaft locking and adjustment apparatus of claim 59 wherein said nut member is attached to said by a first set of fastening means which ride and are movable in equally spaced fastening openings of said nut member when said outer knurled cylinder is moved between said locked and unlocked positions.

61. The fastener/shaft locking and adjustment apparatus of claim 59 wherein said outer knurled cylinder and said rotatable spline include corresponding sets of through-holes for receiving a second set of fastening means for securing said second knurled cylinder and said rotatable spline.

62. The fastener/shaft locking and adjustment apparatus of claim 57 wherein said return spring is biased between said end flange of said locking spline and an inwardly extending annular flange of said outer knurled cylinder.

63. The fastener/shaft locking and adjustment apparatus of claim 57 wherein said positive said positive locking nut further includes means for precisely positioning the locking nut along said elongated element.

64. The fastener/shaft locking and adjustment apparatus of claim 63 wherein said precise positioning means includes a plurality of vernier marks being provided on an outward face of said outer knurled cylinder.

65. The fastener/shaft locking and adjustment apparatus of claim 64 wherein said plurality of vernier marks includes 60 to 2 vernier marks each respectively designating 6° to 180° angular degrees of rotation.

66. The fastener/shaft locking and adjustment of claim 65 wherein said precise positioning means further includes a fixed notch extending along the length of a main body portion of said locking spline which acts as a reference point to align with the desired vernier mark of said plurality of vernier marks upon rotation of said outer knurled cylinder to precisely position the locking nut relative to said elongated element.

67. The fastener/shaft locking and adjustment apparatus of claim 66 wherein said first and second gears each have 60 to 4 teeth to thereby respectively provide 6° to 180° angular degrees of rotation for each tooth adjustment.

68. The fastener/shaft locking and adjustment apparatus of claim 67 wherein each tooth adjustment of 6° to 180° degrees of angular rotation respectively provides for 0.0008" travel of the locking nut on said elongated element to provide for precise positioning of the locking nut along said elongated element.

69. A positive locking nut adapted to be axially received on and to be removably fixed along the length of an elongated element having a channel along the length thereof, comprising: a first generally cylindrical body member having an axially extending passage extending therethrough for receiving said element, said first body member having a key member extending into said passage which is engaged in the channel of the elongated element such that said first body member does not rotate with respect to said elongated element; said first body member further including a first gear along an end flange thereof;

a second generally cylindrical body member surrounding said first cylindrical body member and defining a space therebetween;

a third cylindrical body member attached to said second body member so that said second and third body members are rotatable about said elongated element, said third body member having a second gear capable of meshing engagement with said first gear wherein said third body member is movable between an engaged position, wherein said second gear is in meshing engagement with said first gear so that the locking nut is locked in its desired position along the elongated element, and a disengaged position, wherein said second gear is disengaged from said first gear so that the second and third body members can be rotated with respect to the elongated element and the position of the locking nut can be adjusted along the elongated element; and means for biasing provided in said space surrounding said first body member for normally biasing said second body member in a locked position wherein said first and second gears are in said engaged position, said biasing means including a return spring which is biased between said end flange of said first body member and an inwardly extending annular flange of said second and third body members.

70. A positive locking nut adapted to be axially received on and to be removably fixed along the length of an elongated element having a channel along the length thereof, comprising: a first generally cylindrical body member having an axially extending passage extending therethrough for receiving said element, said first body member having a key member extending into said passage which is engaged in the channel of the elongated element such that said first body member does not rotate with respect to said elongated element; said first body member further including a first gear along an end flange thereof;

a second generally cylindrical body member surrounding said first cylindrical body member and defining a space therebetween;

a third cylindrical body member attached to said second body member so that said second and third body members are rotatable about said elongated element, said third body member having a second gear capable of meshing engagement with said first gear wherein said third body member is movable between an engaged position, wherein said second gear is in meshing engagement with said first gear so that the locking nut is locked in its desired position along the elongated element, and a disengaged position, wherein said second gear is disengaged from said first gear so that the second and third body members can be rotated with respect to the elongated element and the position of the locking nut can be adjusted along the elongated element;

means for biasing provided in said space surrounding said first body member for normally biasing said second body member in a locked position wherein said first and second gears are in said engaged position; and means for precisely positioning the locking nut along said elongated element.

71. The positive locking nut of claim 70 wherein said precise positioning means includes a plurality of vernier marks being provided on an outward face of said second body member.

72. The positive locking nut of claim 71 wherein said plurality of vernier marks includes 60 to 2 vernier marks each designating respectively 6° to 180° angular degrees of rotation.

73. The positive locking nut of claim 71 wherein said precise positioning means further includes a fixed notch extending along the length of a main body portion of said first body member which acts as a reference point to align with the desired vernier mark of said plurality of vernier marks upon rotation of said second body member to precisely position the locking nut relative to said elongated element.

74. A positive locking nut adapted to be axially received on and to be removably fixes along the length of an elongated element having a channel along the length thereof, comprising: a first generally cylindrical body member having an axially extending passage extending therethrough for receiving said element, said first body member having a key member extending into said passage which is engaged in the channel of the elongated element such that said first body member does not rotate with respect to said elongated element; said first body member further including a first gear along an end flange thereof;

a second generally cylindrical body member surrounding said first cylindrical body member and defining a space therebetween;

a third cylindrical body member attached to said second body member so that said second and third body members are rotatable about said elongated element, said third body member having a second gear capable of meshing engagement with said first gear wherein said third body member is movable between an engaged position, wherein said second gear is in meshing engagement with said first gear so that the locking nut is locked in its desired position along the elongated element, and a disengaged position, wherein said second gear is disengaged from said first gear so that the second and third body members can be rotated with respect to the elongated element and the position of the locking nut can be adjusted along the elongated element; and means for biasing provided in said space surrounding said first body member for normally biasing said second body member in a locked position wherein said first and second gears are in said engaged position, said first and second gears each having 60 to 4 teeth to thereby respectively provide 6 to 180 angular degrees of rotation for each tooth adjustment.

75. The positive locking nut of claim 74 wherein each tooth adjustment of 6° to 180° degrees of angular rotation provides respectively for 0.0008" to 0.100" travel of the locking nut on said elongated element to provide for precise positioning of the locking nut along said elongated element.

76. A fastener/shaft locking and adjustment apparatus comprising:

a threaded elongated element having a channel along the length thereof;

a positive locking nut adapted to be axially received on and removably fixed along the length of said elongated element, the positive locking nut comprising:

a first generally cylindrical body member having an axially extending passage extending therethrough for receiving said element, said first body member having a key member extending into said passage which is engaged in the channel of the elongated element such that said first body member does not rotate with respect to said elongated element; said first body member further including a first gear along an end flange thereof;

a second generally cylindrical body member surrounding said first cylindrical body member and defining a space therebetween;

a third cylindrical body member attached to said second body member so that said second and third body members are rotatable about said elongated element, said third body member having a second gear capable of meshing engagement with said first gear wherein said third body member is movable between an engaged position, wherein said second gear is in meshing engagement with said first gear so that the locking nut is locked in its desired position along the elongated element, and a disengaged position, wherein said second gear is disengaged from said first gear so that the second and third body members can be rotated with respect to the elongated element and the position of the locking nut can be adjusted along the elongated element; and means for biasing provided in said space surrounding said first body member for normally biasing said second body member in a locked position wherein said first and second gears are in said engaged position, said biasing means including a return spring which is biased between said end flange of said first body member and an inwardly extending annular flange of said second and third body members.

77. A fastener/shaft locking and adjustment apparatus comprising:

a threaded elongated element having a channel along the length thereof;

a positive locking nut adapted to be axially received on and removably fixed along the length of elongated element, the positive locking nut comprising:

a first generally cylindrical body member having an axially extending passage extending therethrough for receiving said element, said first body member having a key member extending into said passage which is engaged in the channel of the elongated element such that said first body member does not rotate with respect to said elongated element; said first body member further including a first gear along an end flange thereof;

a second generally cylindrical body member surrounding said first cylindrical body member and defining a space therebetween;

a third cylindrical body member attached to said second body member so that said second and third body members are rotatable about said elongated element, said third body member having a second gear capable of meshing engagement with said first gear wherein said third body member is movable between an engaged position, wherein said second gear is in meshing engagement with said first gear so that the locking nut is locked in its desired position along the elongated element, and a disengaged position, wherein said second gear is disengaged from said first gear so that the second and third body members can be rotated with respect to the elongated element and the position of the locking nut can be adjusted along the elongated element;

means for biasing provided in said space surrounding said first body member for normally biasing said second body member in a locked position wherein said first and second gears are in said engaged position; and means for precisely positioning the locking nut along said elongated element.

78. The fastener/shaft locking adjustment apparatus of claim 77 wherein said precise positioning means includes a plurality of vernier marks being provided on an outward face of said second body member.

79. The fastener/shaft locking and adjustment apparatus of claim 78 wherein said plurality of vernier marks includes 60 to 2 vernier marks each designating respectively 6 to 180 angular degrees of rotation.

80. The fastener/shaft locking and adjustment apparatus of claim 78 wherein said precise positioning means further includes a fixed notch extending along the length of a main body portion of said first body member which acts as a reference point to align with the desired vernier mark of said plurality of vernier marks upon rotation of said second body member to precisely position the locking nut relative to said elongated element.

81. A fastener/shaft locking and adjustment apparatus comprising:

a threaded elongated element having a channel along the length thereof;

a positive locking nut adapted to be axially received on and removably fixed along the length of said elongated element, the positive locking nut comprising:

a first generally cylindrical body member having an axially extending passage extending therethrough for receiving said element, said first body member having a key member extending into said passage which is engaged in the channel of the elongated element such that said first body member does not rotate with respect to said elongated element; said first body member further including a first gear along an end flange thereof;

a second generally cylindrical body member surrounding said first cylindrical body member and defining a space therebetween;

a third cylindrical body member attached to said second body member so that said second and third body members are rotatable about said elongated element, said third body member having a second gear capable of meshing engagement with said first gear wherein said third body member is movable between an engaged position, wherein said second gear is in meshing engagement with said first gear so that the locking nut is locked in its desired position along the elongated element, and a disengaged position, wherein said second gear is disengaged from said first gear so that the second and third body members can be rotated with respect to the elongated element and the position of the locking nut can be adjusted along the elongated element;

means for biasing provided in said space surrounding said first body member for normally biasing said second body member in a locked position wherein said first and second gears are in said engaged position; and wherein said first and second gears each have 60 to 4 teeth to thereby respectively provide 6° to 180° angular degrees of rotation for each tooth adjustment.

82. The fastener/shaft locking and adjustment apparatus of claim 81 wherein each tooth adjustment of 6° to 180° degrees of angular rotation respectfully provides for 0.0008" to 0.100° travel of the locking nut on said elongated element to provide for precise positioning of the locking nut along said elongated element.

* * * * *